United States Patent
Li et al.

(10) Patent No.: US 9,058,762 B2
(45) Date of Patent: Jun. 16, 2015

(54) APPARATUS AND METHOD FOR DRIVING LED DISPLAY

(71) Applicant: SCT TECHNOLOGY, LTD., Grand Cayman (KY)

(72) Inventors: Eric Li, Milpitas, CA (US);
Shang-Kuan Tang, Fremont, CA (US);
Shen Lei, Guangzhou (CN); Yi Zhang, San Jose, CA (US)

(73) Assignee: SCT TECHNOLOGY, LTD., Grand Cayman (KY)

( * ) Notice: Subject to any disclaimer, the term of this patent is extended or adjusted under 35 U.S.C. 154(b) by 0 days.

(21) Appl. No.: 14/082,841

(22) Filed: Nov. 18, 2013

(65) Prior Publication Data
US 2015/0137705 A1    May 21, 2015

(51) Int. Cl.
*H05B 37/02* (2006.01)
*G09G 3/32* (2006.01)
*G09G 5/10* (2006.01)

(52) U.S. Cl.
CPC .................................. *G09G 5/10* (2013.01)

(58) Field of Classification Search
USPC .............. 315/294, 297, 299, 307; 345/46, 82, 345/102
See application file for complete search history.

(56) References Cited

U.S. PATENT DOCUMENTS

| | | | |
|---|---|---|---|
| 6,400,349 B1* | 6/2002 | Nagumo | 345/82 |
| 6,980,181 B2* | 12/2005 | Sudo | 345/82 |
| 8,154,217 B2* | 4/2012 | Bergmann et al. | 315/291 |
| 2005/0068275 A1* | 3/2005 | Kane | 345/82 |
| 2008/0174253 A1* | 7/2008 | Noda | 315/291 |
| 2011/0043134 A1* | 2/2011 | Lee | 315/294 |
| 2012/0074845 A1* | 3/2012 | Aoki et al. | 315/119 |

* cited by examiner

*Primary Examiner* — Tung X Le
(74) *Attorney, Agent, or Firm* — Novick, Kim & Lee, PLLC; Allen Xue

(57) ABSTRACT

This disclosure provides an output stage for a LED driver circuit. The output stage has an input module, a regulator module for maintaining a constant internal voltage, and an output module for generating output signals.

11 Claims, 5 Drawing Sheets

APPARATUS AND METHOD FOR DRIVING LED DISPLAY

TECHNICAL FIELD

Figure 1A:
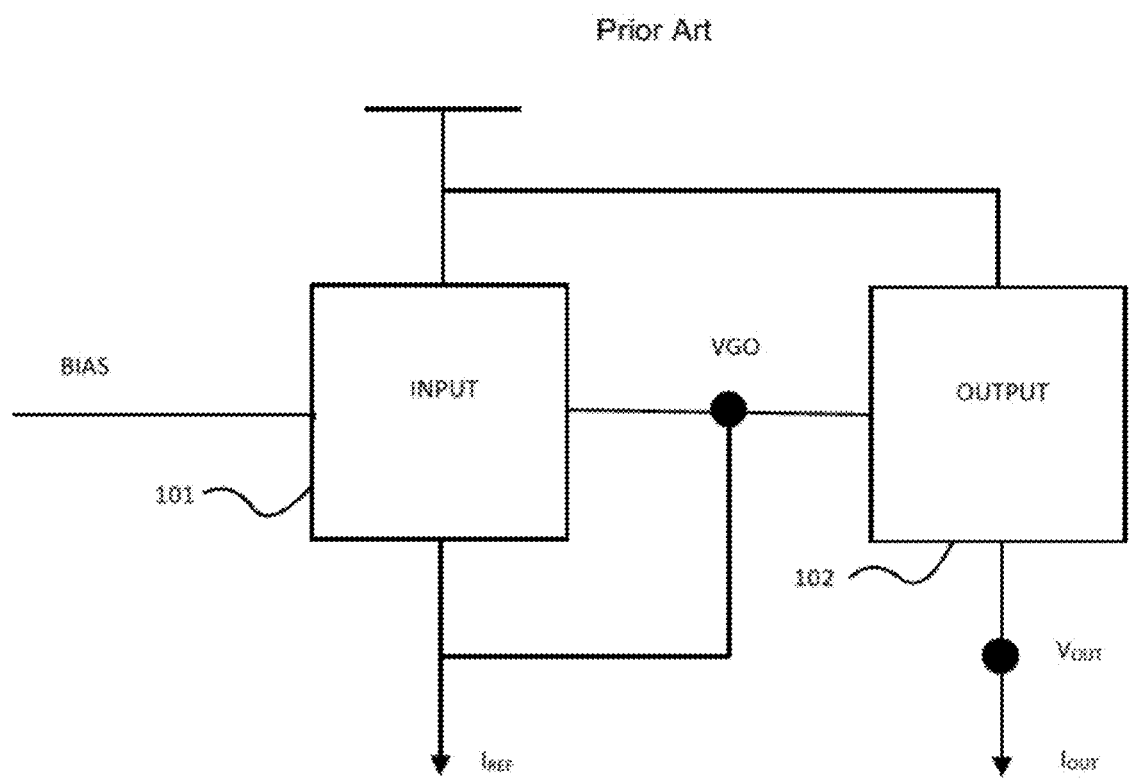

The present disclosure relates generally to devices, circuits, and methods for driving light emitting diode (LED) display panels. More particularly, the present disclosure relates to devices, circuits, and methods related to an output stage of a LED driver.

BACKGROUND

Light emitting diodes, or LEDs, have been widely implemented in electronic devices and applications, including LED display panels. With the increased use of LED display panels, smaller pitch LED display panels are increasingly used for large-area high-quality displays. Smaller LED pitch leads to a higher LED density so that a relative lower brightness in each individual LED is sufficient to achieve the same brightness level required by display panel design. Additionally, with the increased LED efficiency, a lower driving current can achieve the same brightness level. In LED driver design, the internal reference current, or bias, is proportional to the output current. In conventional LED driver designs, it may take a small reference current a long time to charge the internal node with a relatively large capacitance to the target level. This time delay reduces the LED PWM pulse width and affects the brightness level. In addition, variations in the internal node capacitance cause the PWM pulse width to vary among LED drivers. Therefore, methods and devices are needed to solve above-discussed problems.

SUMMARY OF INVENTION

In one embodiment, there is provided a driver for an LED display panel. The driver comprises an output stage, which provides a constant current to drive the LED display panel. The output stage of the LED driver comprises an input module, a regulator module for maintaining a constant internal voltage, an output module for providing output signals. The regulator module is operatively connected to the output module. The input module is operatively connected to the regulator module. The regulator module further comprises an operational amplifier and two or more output gate drivers. The operational amplifier further comprises an inverting input, a non-inverting input and an output. The inverting input of the amplifier is connected to the input module, and the output of the amplifier is connected to the input module. Each output gate driver further comprises a source follower for maintaining a constant internal voltage.

In one aspect of the embodiment, the input module further comprises a first P-channel MOS cascade transistor and a second P-channel MOS cascade transistor. The output module further comprises a P-channel MOS output transistor. The regulator module further comprises an operational amplifier, a first output gate driver and a second output gate driver.

In another aspect of the embodiment, the first output gate driver comprises a first P-channel MOS right transistors, a second P-channel MOS right transistors as source follower, and an N-channel MOS right transistors. The second output gate driver comprises a first P-channel MOS right transistors, a second P-channel MOS right transistor as source follower, and an N-channel MOS right transistors. The two P-channel MOS right transistors share a common gate, the two P-channel MOS right transistors share a common source.

Furthermore, the operational amplifier's output is connected to the gate of the second P-channel MOS cascade transistor of the input module, inverting input is connected to the drain of the first P-channel MOS cascade transistor of the input module and the source of the second P-channel MOS cascade transistor of the input module, the non-inverting input is connected to the drain of the P-channel MOS output transistor of the output module.

The disclosure also provides a method for driving an LED driver output stage. The method comprises the steps of providing a reference current to an input module in the LED driver output stage; controlling a voltage difference between the input module and an output module substantially constant using a voltage regulator; and generating a constant output current. The voltage regulator comprises an operational amplifier, a first output gate driver and at least one additional output gate driver.

In a further embodiment, there is provided an LED display system that has an LED driver and an LED display panel. The LED driver comprises an output stage that has a regulator module for maintaining a constant internal voltage. The LED display panels have LEDs arranged either in a common cathode arrangement or a common anode arrangement.

DESCRIPTIONS OF DRAWINGS

The teachings of the present disclosure can be readily understood by considering the following detailed descriptions in conjunction with the accompanying drawings.

FIG. 1A is a functional diagram of a traditional LED driver design.

Figure 1B:
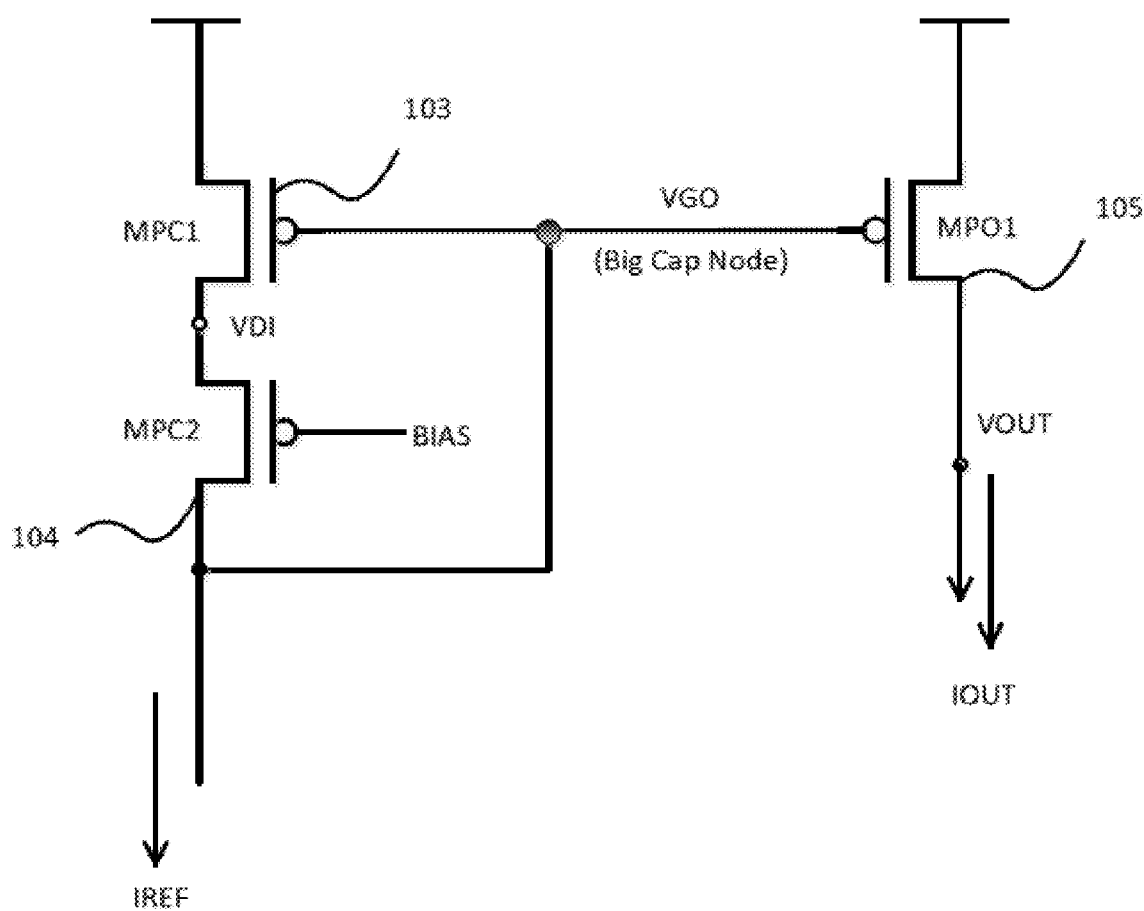

FIG. 1B schematically illustrates a traditional LED driver circuit design.

Figure 2A:
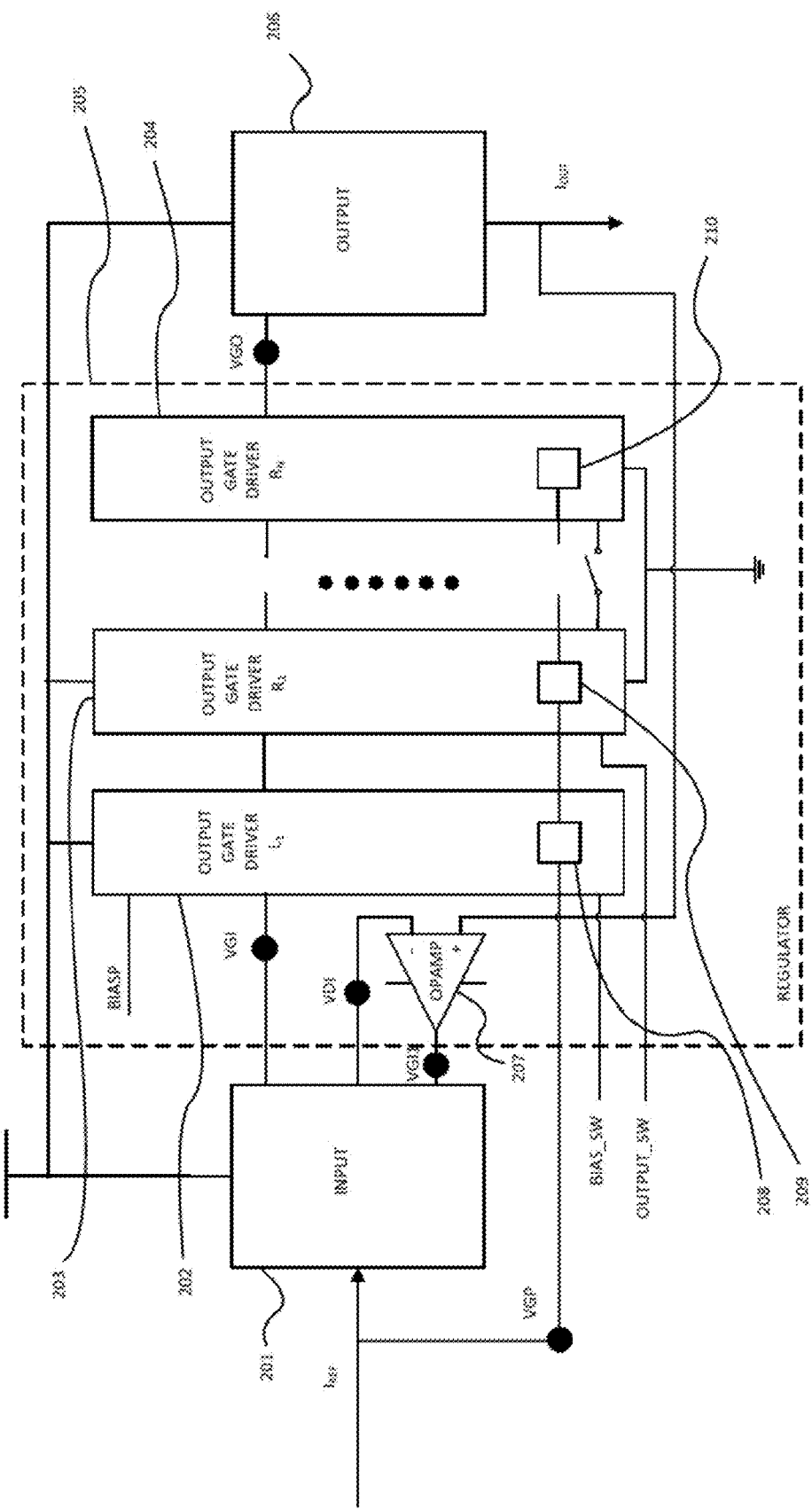

FIG. 2A is a functional diagram of an LED driver design for one embodiment according to the current disclosure.

Figure 2B:
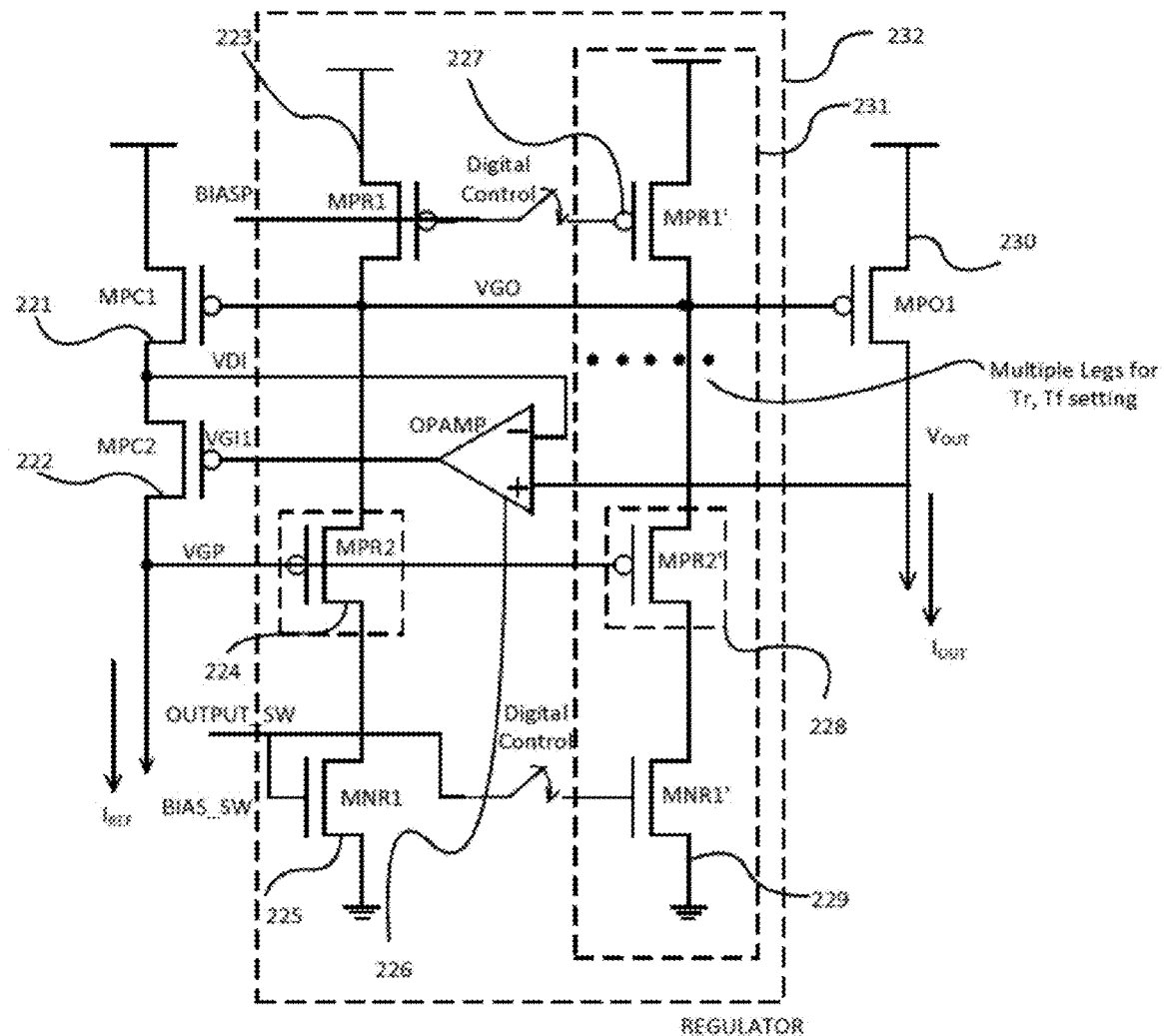

FIG. 2B schematically illustrates an embodiment according to the current disclosure.

Figure 2C:
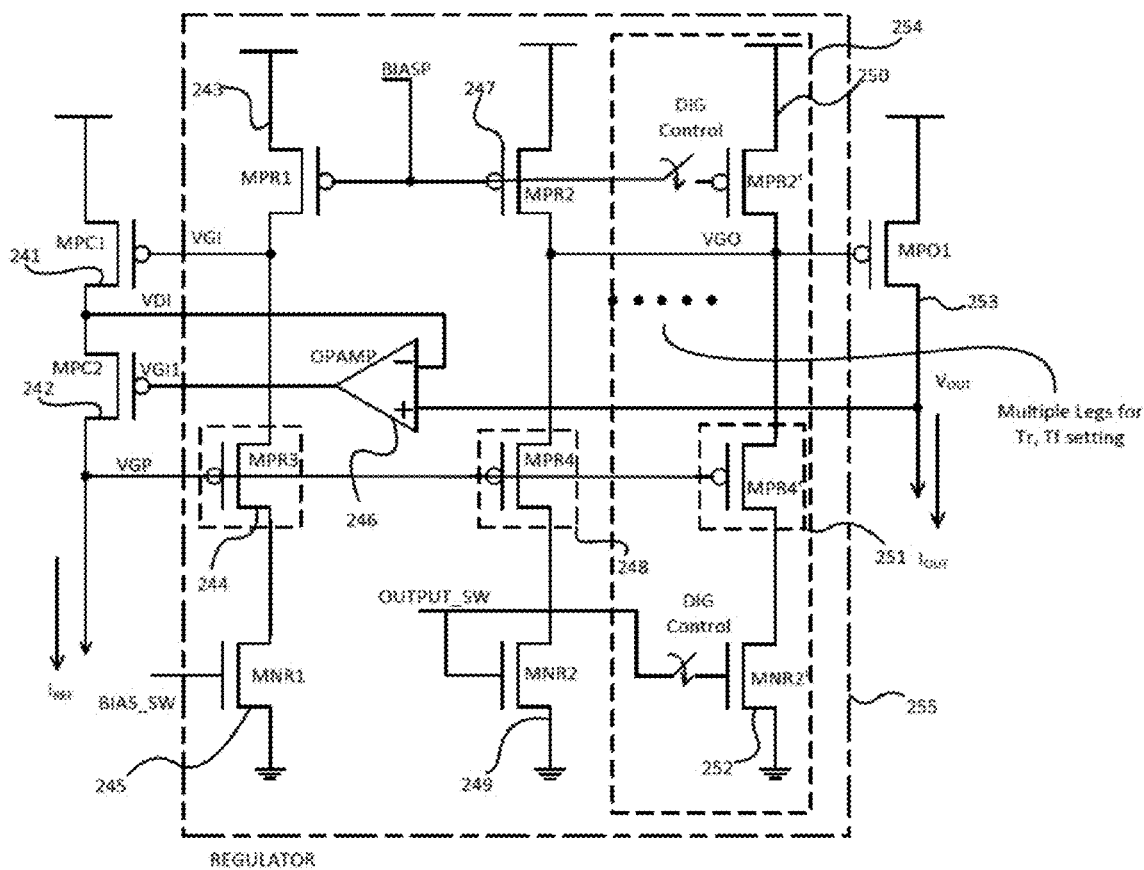

FIG. 2C schematically illustrates another embodiment according to the current disclosure.

DETAILED DESCRIPTION OF THE EMBODIMENT

The figures (FIG.) and the following descriptions relate to the embodiments of the present disclosure by way of illustration only. It should be noted that from the following discussion, alternative embodiments of the structures and/or methods disclosed herein will be readily recognized as viable alternatives that may be employed without departing from the principles of the claimed inventions.

Reference will now be made in detail to several embodiments of the present disclosure(s), examples of which are illustrated in the accompanying figures. It is noted that wherever practicable similar or like reference numbers may be used in the figures and may indicate similar or like functionality. The figures depict embodiments of the present disclosure for the purposes of illustration only. One skilled in the art will readily recognize from the following description that alternative embodiments of the structures and methods illustrated herein may be employed without departing from the principles of the disclosure described herein.

FIG. 1A is a block diagram of an output stage for a LED driver. It has an input module 101 and an output module 102. A bias and a reference current $I_{REF}$ are applied on the input module 101. The input module 101 and the output module 102 are operatively connected to a node VGO, which is a big capacitance node. Output current $I_{OUT}$ and output voltage $V_{OUT}$ are output from the output module.

FIG. 1B schematically illustrates an output stage for a traditional LED driver circuit design. In this embodiment, the input module has a P-MOS cascade transistor 103 named MPC1. 104 is another P-MOS cascade transistor named MPC2. The output module 105 is a P-MOS output transistor named MPO1. The source of 104(MPC2) and the drain of 103(MPC1) are connected to VDI, which is intrinsic drain voltage. The bias is applied to the gate of 104(MPC2). The gate of 103(MPC1) and the gate of 105(MPO1) are connected together as VGO, which is gate output voltage. The drain of 104(MPC2) is electrically connected to node VGO. A reference current $I_{REF}$ is applied to the input module and the node VGO. The drain 105(MPO1) outputs $V_{OUT}$ and $I_{OUT}$.

FIG. 2A schematically illustrates an embodiment according to the present disclosure. In FIG. 2A, an input module 201 is connected to a regulator module 205. The regulator module 205 is connected to an output module 206. A regulator module has a voltage regulator, which automatically maintains a constant voltage level.

The regulator module 205 includes an operational amplifier (OPAMP) 207 and a plurality of output gate drivers 202, 203, and 204. Each of the output drivers includes a source follower. A source follower is also known as a common-drain amplifier. It is used as a voltage buffer in the present disclosure. The voltage difference between gate and source of source follower roughly equals to the threshold voltage of MOS transistor, which is a constant. In this disclosure, the term "internal voltage" refers to a voltage drop across the driver output stage. The output gate driver 202 contains a source follower 208. The output gate driver 203 contains a source follower 209. The output gate driver 204 contains a source follower 210. The driving capability of source follower is determined by the bias current controlled by BIASP.

FIG. 2B illustrates one embodiment of the LED driver design in the present disclosure having two output gate drivers. The input modules in FIG. 2B includes two P-MOS cascade transistors 221(MPC1) and 222(MPC2). The drain of transistor 221(MPC1) is connected to the source of transistor 222(MPC2) to form node VDI. VDI is also connected to the inverting input of an operational amplifier 226. An operational amplifier is a DC-coupled high-gain electronic voltage amplifier with a differential input and usually a single-ended output. The OPAMP's differential inputs include a non-inverting input V+ and an inverting input V−.

The output module in FIG. 2B includes a P-MOS transistor 230(MPO1). The non-inverting input of the operational amplifier 226 is connected to the drain of the transistor 230 (MPO1). The voltage on the drain of transistor 230(MPO1) is $V_{OUT}$. The output of operational amplifier 226 is connected to the gate of transistor 222(MPC2) at the node VGI1. The operational amplifier 226 is used to maintain VDI and $V_{OUT}$ at the same value. The output voltage of OPAMP VGI1 is given by the equation:

$$V_{OPAMP\_OUT}=VGI1=A_{OL}*(V+-V-)=A_{OL}*(V_{OUT}-VDI)$$

where $A_{OL}$ is the open loop gain of the amplifier.

The source follower in FIG. 2B includes two P-MOS transistors 224(MPR2) and 228(MPR2'), which share a common gate node VGP. The common gate VGP serves as the input and is connected to reference current $I_{REF}$. The PMOS transistors 224(MPR2) and 228(MPR2') share a common source node VGO. In the present configuration, the source follower is added as a voltage buffer to separate VGP and VGO and to maintain the difference between VGO and VGP a constant, i.e., VGO=VGP+Constant.

In the embodiment in FIG. 2B, the first output gate driver also includes a P-MOS transistor 223(MPR1) and an N-MOS transistor 225(MNR1), the second output gate driver also includes a P-MOS transistor 227(MPR1') and an N-MOS transistor 229(MNR1'). The gates of transistors 223(MPR1) and 227(MPR1') are separated by a switch. A bias BIASP is applied on the common gate. The drains of transistors 223 (MPR1) and 227(MPR1') are connected to node VGO. VGO is also connected to the gate of transistor 221(MPC1) and the gate of transistor 230(MPO1). The drain of transistor 224 (MPR2) is connected to the source of transistor 225(MNR1), and the drain of transistor 228(MPR2') is connected to the source of the transistor 229(MNR1'). The gate of transistor 225(MNR1) and the transistor 229(MNR1') are separated by a switch. The switch is for PWM control.

N-channel MOS right transistors 225(MNR1) and 229 (MNR1') share a grounded common drain. N-MOS right transistors 225(MNR1) and 229(MNR1') also share a common gate, which is connected to output enable switch OUTPUT_SW. The gate of 229(MNR1') and OUTPUT_SW are separated by a switch.

In FIG. 2B, the reference current $I_{REF}$ drives the gate of the source follower VGP. The capacitance of VGP is smaller than the capacitance of VGO. The source follower drives the gate of output transistor VGO. Accordingly, the voltage difference between VGP and VGO is a constant.

Rise time, $T_r$, is the time it takes for the driving current to change from a pre-determined lower value to a pre-determined higher value. Fall time, $T_f$, is the time it takes for the driving current to change from a pre-determined higher value to a pre-determined lower value. In FIG. 2B, $T_r$ and/or $T_f$ can be adjusted by digitally varying the bias current, BIASP, or varying the size of the source follower. The size of the source follower can be adjusted by adding or reducing the number of the output gate drivers 231.

The operational amplifier OPAMP keeps the output current $I_{OUT}$ constant. It forms a negative feedback loop to control the gate of P-MOS cascade transistor 222(MPC2) so that the drain-source voltage VDS of P-MOS cascade transistor 221 (MPC1) matches the drain-source voltage VDS of P-MOS output transistor 230(MPO1). The OPAMP is implemented to keep a constant output current. $V_{OUT}$ is defined by the system design and LED characteristics, such as LED $V_f$ and internal impedance. When $V_{OUT}$ changes, the feedback loop responds to the gate voltage of 242(MPC2), then VDI follows and eventually matches $V_{OUT}$. Accordingly, P-MOS cascade transistor 241(MPC1) and P-MOS output transistor 253(MPO1) have the same voltage bias to keep the current ratio between $I_{OUT}$ and $I_{REF}$ constant.

FIG. 2C schematically illustrates another embodiment according to the present disclosure. Compared with the embodiment in FIG. 2B, a third output gate driver 254 is added. The three output gate drivers together with the operational amplifier functions as a voltage regulator.

The source followers in FIG. 2C include three P-channel MOS right transistors 244(MPR3), 248(MPR4), and 251 (MPR4'). The gate is common to all three PMOS right transistors. The common gate node is VGP, which serves as the input and is connected to reference current $I_{REF}$. PMOS right transistors 248(MPR4) and 251(MPR4') also share a common source VGO. The source follower is added as a voltage buffer to isolate node VGP and node VGO.

In FIG. 2C, on the left hand side, also known as the driving side, or input side, there are two P-channel MOS cascade transistors 241(MPC1) and 242(MPC2). On the right hand side, or the output side, of FIG. 2C, there is a P-channel MOS output transistor 253(MPO1). In addition, there are three more P-channel MOS right transistors 243(MPR1), 247(MPR2) and 250(MPR2'), three P-channel MOS right transistors 244(MPR3), 248(MPR4) and 251(MPR4'), and an operational amplifier 246(OPAMP).

The operational amplifier 246 OPAMP's differential inputs comprises of a non-inverting input V+ and an inverting input V−. V− is connected to node VDI. VDI also connects to the drain of P-MOS cascade transistor 241(MPC1) and the source of P-MOS cascade transistor 242(MPC2). V+ is connected to node $V_{OUT}$. $V_{OUT}$ is the drain of P-MOS output transistor 253(MPO1). The output of OPAMP is connected to the gate of P-MOS cascade transistor 242(MPC2), this node is called VGI1. The output voltage of OPAMP VGI1 is given by the equation:

$$V_{OPAMP\_OUT}=VGI1=A_{OL}*(V+-V-)=A_{OL}*(V_{OUT}-VDI)$$

where $A_{OL}$ is the open loop gain of the amplifier.

P-MOS right transistors 247(MPR2) and 250(MPR2') share a common drain VGO, which is also connected to the gate of P-MOS output transistor 253(MPO1). As mentioned above, VGO is also connected to the common source of P-MOS right transistors 248(MPR4) and 251(MPR4') of the source follower. The drain of P-MOS right transistors 243 (MPR1) is connected to the gate of P-MOS cascade transistor 241(MPC1) and the source of P-MOS right transistor 244 (MPR3). The node is called VGI. A bias BIASP is applied to the common gate of P-MOS right transistors 243(MPR1), 247(MPR2) and 250(MPR2'), with a DIG control separating BIASP and the gate of 250(MPR2'). DIG control is implemented for PWM control.

N-channel MOS right transistors 245(MNR1), 249(MNR2) and 252(MNR2') share a common drain and the common drain is grounded. N-MOS right transistors 249 (MNR2) and 252(MNR2') also share a common gate, which is then connected to output enable switch: OUTPUT_SW. The gate of 252(MNR2') and OUTPUT_SW are separated by a DIG control. The source of N-MOS right transistor 245 (MNR1) is connected to the drain of P-MOS transistor 244 (MPR3) inside the source follower. The gate of N-MOS right transistor 245(MNR1) is connected to an internal bias enable switch BIAS_SW. The source of N-MOS right transistor 249(MNR2) is connected to the drain of P-MOS transistor 248(MPR4) inside the source follower. The source of N-MOS right transistor 252(MNR2') is connected to the drain of P-MOS transistor 251(MPR4') inside the source follower.

The reference current $I_{REF}$ drives the gate of the source follower VGP. The capacitance of VGP, the gate of the source follower, is much smaller than the capacitance of VGO, the gate of output transistor. The source follower drives the gate of output transistor VGO. The voltage difference between VGP and VGO is a constant, i.e., VGP−VGO=constant. This structure functions as a current mirror.

Similar to FIG. 2B, $T_r$ and/or $T_f$ can be adjusted by digitally varying the bias current, BIASP, or the size of the source follower. The operational amplifier OPAMP 246 is implemented to form a negative feedback loop to control the gate of P-MOS cascade transistor 242(MPC2), so that the drain-source voltage VDS of P-MOS cascade transistor 241(MPC1) matches the drain-source voltage VDS of P-MOS output transistor 253(MPO1). $V_{OUT}$ variation is eliminated, and as a result, $I_{OUT}$ variation is also eliminated. Source follower transistors 244(MPR3), 248(MPR4) and 251 (MPR4'), and the reference current, $I_{REF}$, are well selected to ensure that the VGI and VGP are stabilized before they are used.

In FIG. 2C, the current output is on during normal operations. Both BIAS_SW and OUTPUT_SW are in the state of logic high. The bias voltages VGI and VGP are generated by the left hand side of regulator with the reference current $I_{REF}$. At the same time VGP also drives the right hand side of regulator and generates the voltage of VGO. VGO and VGI have the same voltage. The small reference current is isolated from the large gate capacitance of output PMOS driver. The right hand side of regulator is scalable by digital setting. Switching time of VGO can be controlled accordingly. The switching time of the output current can be defined digitally.

The bias voltage BIASP is used to control the switching time of current output in analog mode. When BIASP changes, the current flowing through the regulator changes accordingly. As a result it affects the VGO switching time and it also affects the switching time of output current.

Similar to FIG. 2B, the OPAMP is implemented to keep constant output current. $V_{OUT}$ is defined by the system design and LED characteristics, such as LED $V_f$ and internal impedance. When $V_{OUT}$ changes, the feedback loop responds to the gate voltage of 242(MPC2), then VDI follows and eventually matches $V_{OUT}$. Accordingly, P-MOS cascade transistor 241 (MPC1) and P-MOS output transistor 253(MPO1) have exactly the same voltage bias to keep the current ratio between $I_{OUT}$ and $I_{REF}$ constant.

On the other hand, in FIG. 2B, after channel turns ON (OUTPUT_SW goes high), VGI1, VGO and VGP start switching toward final values. While in FIG. 2C, after BIAS_SW turns ON, VGP and VGI start switching. OUTPUT_SW turns ON after VGP and VGI become stable. VGO switches following OUTPUT_SW turns on. Since VGP is stable before OUTPUT_SW turns ON, VGO responses faster and is less dependent on $I_{REF}$.

To save power, when PWM is off, there is no output current, so the regulator can be shut down by turning off the N-MOS right transistors 245(MNR1), 249(MNR2), 252 (MNR2'). In an LED display system, there is an OFF period followed by a dead time between scan lines. Dead time is implemented to eliminate artifacts such as ghost effect. In the present disclosure, N-MOS right transistor 245(MNR1) is turned on to recover the bias voltages VGP and VGI of the regulator during the dead time. Accordingly, the internal power consumption becomes smaller for a dimmer setting with small PWM value or black panel.

Many modifications and other embodiments of the disclosure will come to the mind of one skilled in the art having the benefit of the teaching presented in the forgoing descriptions and the associated drawings. For example, the driver circuit can be used to drive an LED array in either a common cathode or a common anode configuration. In a common anode scan configuration, the anodes of the LEDs are operatively connected to a power source via a switch element while the cathodes of the LEDs are tied to output of current drivers. Accordingly, all LEDs are connected to the same power supply and have a same supply voltage. On the other hand, in a common cathode configuration, the anodes of the LEDs are operatively connected to a power source while the anodes of the LEDs are connected to output of current drivers. More detailed descriptions of the common cathode topology and the common anode topology can be found in U.S. application Ser. No. 13/237,960, entitled "LED Display Systems," filed Sep. 21, 2011.

Furthermore, elements in the LED array can be single color LEDs or RGB units or any other forms of LEDs available. The driver circuit can be scaled up or scaled down to drive LED arrays of various sizes. Multiple driver circuits may be employed to drive a plurality of LED arrays in a LED display system. The components in the driver can either be integrated on a single chip or on more than one chip or on the PCB board. Such variations are within the scope of this disclosure. It is to be understood that the disclosure is not to be limited to the specific embodiments disclosed, and that the modifications and embodiments are intended to be included within the scope of the dependent claims.

What is claimed is:

1. An LED driver circuit, comprising:
   an input module configured to receive a reference current;
   a regulator module for maintaining a constant internal voltage;
   an output module for generating output current,
   wherein the input module is operatively connected to the regulator module, and the regulator module is operatively connected to the output module,
   wherein the regulator module further comprises an operational amplifier and two or more output gate drivers,
   wherein the operational amplifier further comprises an inverting input, a non-inverting input and an output, wherein the inverting input of the amplifier and the output of the amplifier are operatively connected to the input module, and
   wherein each of the output gate drivers comprises a first P-channel MOS right transistor, a second P-channel MOS right transistor as a source follower, and an N-channel MOS right transistor,
   wherein the gate of each of the second P-channel MOS right transistors are coupled together and the source of each of the second P-channel MOS right transistors are coupled together.

2. The LED driver circuit of claim 1, wherein the input module further comprises a first cascoded P-channel MOS transistor and a second cascoded P-channel MOS transistor.

3. The LED driver circuit of claim 1, wherein the output module further comprises a P-channel MOS output transistor.

4. The LED driver circuit of claim 1, wherein the output of the operational amplifier is operatively connected to the gate of the second cascoded P-channel MOS transistor of the input module, inverting input of the operational amplifier is connected to the drain of the first cascoded P-channel MOS transistor of the input module and the source of the second cascoded P-channel MOS transistor of the input module, and the non-inverting input is connected to the drain of the P-channel MOS output transistor of the output module.

5. An LED display system, comprising:
   an LED driver circuit of claim 1 coupled to an LED display panel.

6. The LED display system of claim 5, wherein the LED display panel comprises an array of LEDs, wherein the LEDs are arranged in a common cathode configuration.

7. The LED display system of claim 5, wherein the LED display panel comprises an array of LEDs, wherein the LEDs are arranged in a common anode configuration.

8. The LED driver circuit of claim 1, comprises three or more output gate drivers, wherein in at least one output gate driver, the gate of the first P-channel MOS right transistor and the gate of the N-channel MOS right transistor are adapted to receive digital control signals that switches the output gate driver on or off.

9. The LED driver circuit of claim 8, wherein the regulator module is scalable by switching one or more output gate driver on or off.

10. A method for operating an LED driver, comprising the steps of:
    providing a reference current to an input module;
    controlling a voltage difference between the input module and an output module substantially constant using a voltage regulator, wherein the voltage regulator comprises an operational amplifier and two or more output gate drivers, each output gate driver comprises a first P-channel MOS right transistor, a source follower, and an N-channel MOS right transistor;
    driving the source followers with a reference current;
    turning on an internal bias;
    turning on an output switch;
    applying a bias voltage of the source followers; and
    generating an output current.

11. The method of claim 10, wherein the source follower is a P-channel MOS right transistor.

* * * * *